US012628320B2

(12) United States Patent
Uno et al.

(10) Patent No.: US 12,628,320 B2
(45) Date of Patent: May 12, 2026

(54) ELECTROMAGNETIC SHIELDING BODY AND ELECTRONIC DEVICE

(71) Applicant: DENSO CORPORATION, Kariya (JP)

(72) Inventors: Takanori Uno, Kariya (JP); Masashi Inagaki, Kariya (JP)

(73) Assignee: DENSO CORPORATION, Kariya (JP)

( * ) Notice: Subject to any disclaimer, the term of this patent is extended or adjusted under 35 U.S.C. 154(b) by 71 days.

(21) Appl. No.: 18/584,607

(22) Filed: Feb. 22, 2024

(65) Prior Publication Data

US 2024/0407146 A1    Dec. 5, 2024

(30) Foreign Application Priority Data

May 30, 2023    (JP) .................................. 2023-088791

(51) Int. Cl.
*H05K 9/00*          (2006.01)
(52) U.S. Cl.
CPC .................................. *H05K 9/0024* (2013.01)
(58) Field of Classification Search
None
See application file for complete search history.

(56) References Cited

U.S. PATENT DOCUMENTS 6,884,094 B1 * 4/2005 Bernhart ................ H01R 13/28
                                                        439/607.17
7,344,413 B2 * 3/2008 Nishida ............ H01R 13/65912
                                                        439/607.41

9,329,061 B2 * 5/2016 Vanderaa ................ G01D 11/24
10,683,955 B2 * 6/2020 Jeong ........................ F16L 33/02
11,652,500 B2 * 5/2023 Andrew .................... H04B 1/38
                                                        455/552.1
2006/0216974 A1 * 9/2006 Nishigaki .......... H01R 13/6485
                                                        439/92
2008/0289153 A1 * 11/2008 Bowater ................ F16L 33/08
                                                        29/244
2018/0233263 A1 * 8/2018 Mizutani ................ H01F 17/06
2021/0273371 A1 9/2021 Sumida
2022/0368067 A1 11/2022 Sumida
2024/0138130 A1 4/2024 Fuchigami

FOREIGN PATENT DOCUMENTS

JP        S62-071969 U1    5/1987
JP        H08-043440 A     2/1996
JP        H10-079589 A     3/1998
JP        2016-040815 A    3/2016
JP        2018060810 A  *  4/2018

* cited by examiner

*Primary Examiner* — James Wu
*Assistant Examiner* — Christopher L Augustin
(74) *Attorney, Agent, or Firm* — Posz Law Group, PLC

(57)          ABSTRACT

An electromagnetic shielding body includes a first member, a second member, and a fixing member. The first member has a cylindrical shape and has an inner wall that is a wall portion that accommodates a circuit element inside a cylinder. The inner wall has an outer shape without corners. The second member covers the inner wall from an outer peripheral surface side and closes an opening of the inner wall. The fixing member has a shape of a string and is arranged on an outer surface of a portion of the second member that covers the inner wall. The fixing member electrically connects the second member and the inner wall over an entire circumference.

14 Claims, 7 Drawing Sheets

FIG. 3
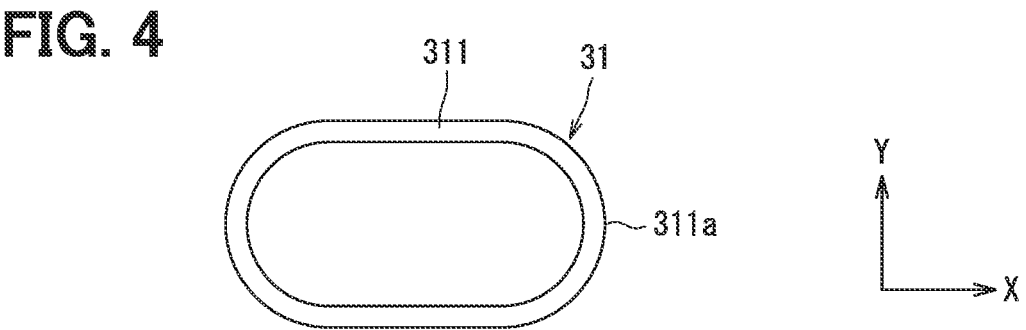
FIG. 4
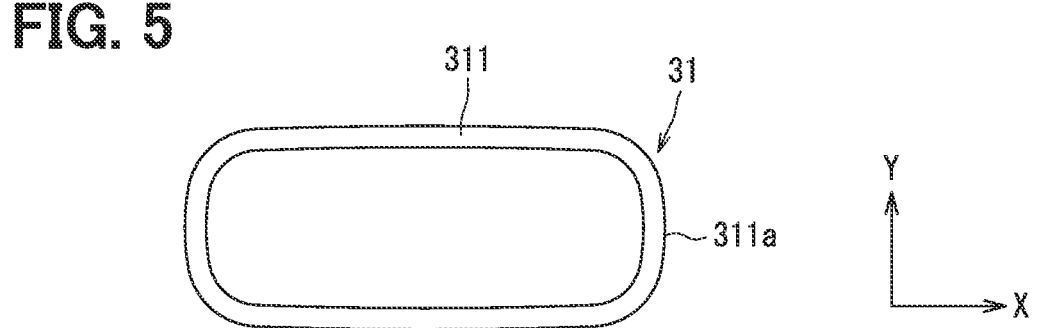
FIG. 5

ELECTROMAGNETIC SHIELDING BODY AND ELECTRONIC DEVICE

CROSS REFERENCE TO RELATED APPLICATIONS

The present application is based on Japanese Patent Application No. 2023-88791 filed on May 30, 2023, the description of which is incorporated herein by reference.

TECHNICAL FIELD

The present disclosure in this specification relates to an electromagnetic shielding body and an electronic device.

BACKGROUND

An electronic device includes a metal shield case.

SUMMARY

One of the objects of the present disclosure is to provide an electromagnetic shielding body and an electronic device that can enhance a shield effect with a simple configuration.

An electromagnetic shielding body, which is one aspect of the disclosure, includes a first member that has a cylindrical shape, a wall portion having an outer shape with no corners in a plan view in an axial direction, and accommodates a circuit element in a cylinder, a second member that covers the wall portion from the outer peripheral surface side and closes one of the openings of the wall portion, and a string-shaped fixing member that is arranged on an outer surface of a part of the second member that covers the wall portion and electrically connects the second member and the wall portion over an entire circumference.

BRIEF DESCRIPTION OF DRAWINGS

FIG. 3 is a cross-sectional view taken along a line III-III of FIG. 1;

FIG. 4 is a plan view showing other example of a first member;

FIG. 5 is a plan view showing other example of a first member;

DETAILED DESCRIPTION

Figure 1:
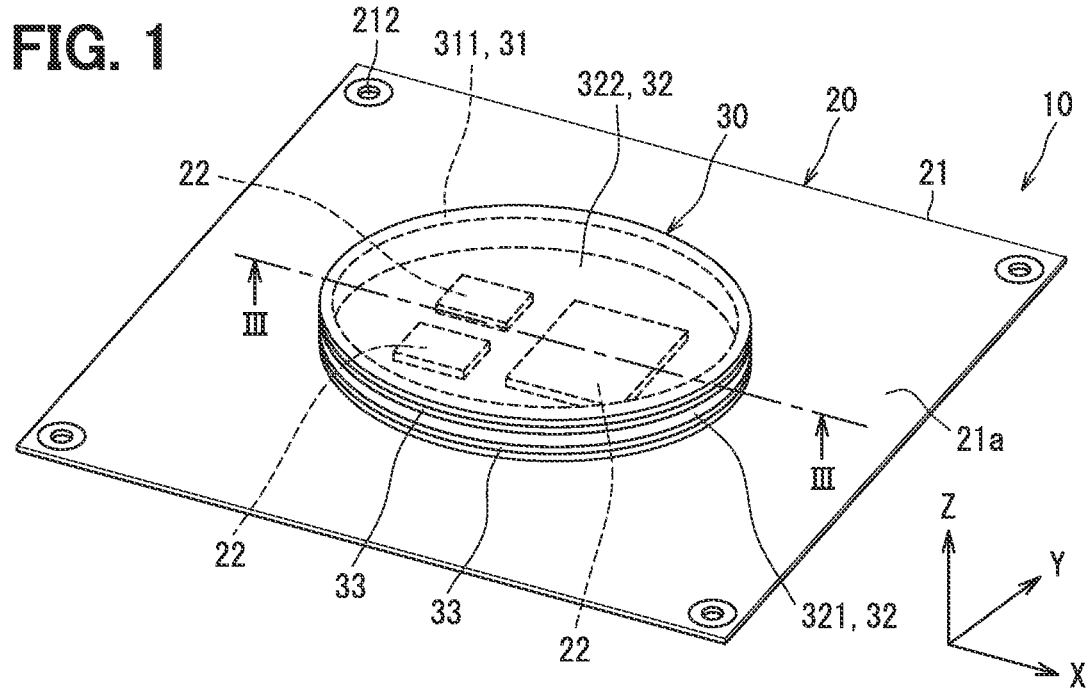
FIG. 1 is a perspective view showing an electromagnetic shielding body and an electronic device according to a first embodiment.

An electronic device includes a metal shield case. A disclosure of JP 2022-75671 A is incorporated herein by reference as an explanation of the technical elements in this disclosure.

A shield case includes a lower case with an opening on one side and a substantially rectangular planar shape and an upper case that closes the opening of the lower case. The upper case and the lower case are fixed at four locations by screws. In the case of such a configuration, the design is made such that surface contact can be made at locations other than those fixed by screws. However, due to manufacturing variations such as surface roughness and mounting variations, electrical connections at locations other than fixed locations are not reliable. A gap functions as a slot antenna, and there is a risk that, for example, electromagnetic noise may leak. In view of the above or other aspects not mentioned, there is a need for further improvements in an electromagnetic shielding body and an electronic device.

One of the objects of the present disclosure is to provide an electromagnetic shielding body and an electronic device that can enhance a shield effect with a simple configuration.

An electromagnetic shielding body, which is one aspect of the disclosure, includes a first member that has a cylindrical shape, a wall portion having an outer shape with no corners in a plan view in an axial direction, and accommodates a circuit element in a cylinder, a second member that covers the wall portion from the outer peripheral surface side and closes one of the openings of the wall portion, and a string-shaped fixing member that is arranged on an outer surface of a part of the second member that covers the wall portion and electrically connects the second member and the wall portion over an entire circumference.

According to the disclosed electromagnetic shielding body, a string-shaped member is used as the fixing member. By tightening the string-shaped fixing member, the second member can be brought into contact with the outer peripheral surface of the wall portion to electrically connect them. Furthermore, since the outer shape of the wall portion does not have corners, the second member and the wall portion can be electrically connected over the entire circumference by tightening the fixing member. Therefore, the shield effect can be enhanced with a simple configuration.

An electronic device according to another aspect of the disclosure includes a circuit board having a printed circuit board, an electronic component mounted on the printed circuit board, and an electromagnetic shielding body for covering a predetermined circuit element on the circuit board. The electromagnetic shielding body includes a first member including a wall portion having a cylindrical shape with an opening and an outer shape without corners in a plan view in an axial direction, and accommodating a circuit element in a cylinder, a second member that covers the wall portion from the outer peripheral surface side and closes one of the openings of the wall portion, and a string-shaped fixing member that is arranged on an outer surface of a part of the second member that covers the wall portion and electrically connects the second member and the wall portion over an entire circumference.

According to the disclosed electronic device, a string-shaped member is used as the fixing member. By tightening the string-shaped fixing member, the second member can be brought into contact with the outer peripheral surface of the wall portion to electrically connect them. Furthermore, since the outer shape of the wall portion does not have corners, the second member and the wall portion can be electrically connected over the entire circumference by tightening the fixing member. Therefore, the shield effect can be enhanced with a simple configuration.

The disclosed aspects in this specification adopt different technical solutions from each other in order to achieve their respective objectives. Reference numerals in parentheses described in claims and this section exemplarily show corresponding relationships with parts of embodiments to be described later and are not intended to limit technical scopes. The objects, features, and advantages disclosed in this specification will become apparent by referring to following detailed descriptions and accompanying drawings.

Hereinafter, a plurality of embodiments will be described with reference to the drawings. The same reference numerals are assigned to the corresponding elements in each embodiment, and thus, duplicate descriptions may be omitted. When only a part of the configuration is described in the respective embodiments, the configuration of the other embodiments described before may be applied to other parts of the configuration. Further, not only the combinations of the configurations explicitly shown in the description of the respective embodiments, but also the configurations of the plurality of embodiments can be partially combined even when they are not explicitly shown as long as there is no difficulty in the combination in particular.

A description A and/or B means at least one of A and B. That is, it may include only A, only B, or both A and B.

First Embodiment

First, a schematic configuration of an electronic device will be explained.
(Electronic Device)

Figure 2:
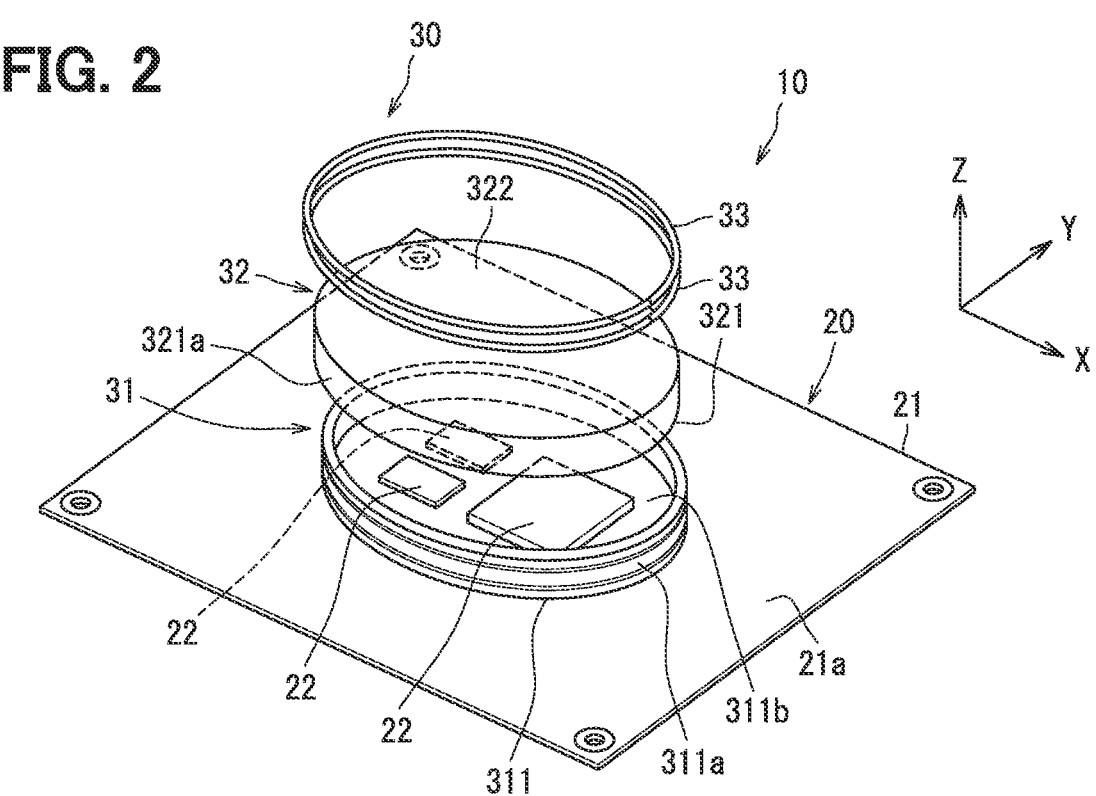
FIG. 2 is an exploded perspective view showing the electromagnetic shielding body and the electronic device.

FIG. 1 is a perspective view of an electronic device. FIG. 2 is an exploded perspective view of the electronic device. FIG. 3 is a cross-sectional view taken along a line III-III of FIG. 1. In FIG. 3, resists and wirings are omitted for convenience. Furthermore, for convenience, electronic components are marked with metal hatching.

Hereinafter, an axial direction of a cylindrical inner wall will be referred to as a Z direction. Further, a direction perpendicular to the Z-direction is referred to a X-direction, and a direction perpendicular to both of the Z-direction and the X-direction is referred to a Y-direction. Unless otherwise specified, a shape viewed in a plane from the Z-direction, that is, a shape along an XY plane defined by the X-direction and Y-direction is referred to as a planar shape. The plan view from the Z direction may be simply referred to as a plan view.

As shown in FIGS. 1, 2, and 3, an electronic device 10 includes a circuit board 20 and an electromagnetic shielding body 30. The electronic device 10 may be fixed to a frame (not shown) of a moving object. The frame is, for example, a chassis of the moving object. The moving object is, for example, a vehicle, a flying object, a ship, a construction machine, an agricultural machine, or the like. As an example, the electronic device 10 of the present embodiment is mounted on the vehicle.

The circuit board 20 includes a printed circuit board 21 and electronic components 22. The printed circuit board 21 is sometimes referred to as a board, a wiring board, or the like. The printed circuit board 21 has one surface 21*a* and a back surface 21*b* which is a surface opposite to the one surface 21*a* in a thickness direction. A planar shape of the printed circuit board 21 is not particularly limited. As an example, the printed circuit board 21 of the present embodiment has a substantially rectangular planar shape. In a state where the electromagnetic shielding body 30 (first member 31) is mounted, the thickness direction of the printed circuit board 21 is substantially parallel to the Z direction.

The printed circuit board 21 includes an insulating base material 211 and wiring elements (not shown) arranged on the insulating base material 211. The insulating base material 211 is formed using an electrically insulating material such as resin. As the insulating base material 211, for example, a material containing only resin may be employed, or a material containing resin in combination with glass cloth, nonwoven fabric, etc. may be employed. The printed circuit board 21 may have fixing holes 212 at four corners of a substantially rectangular planar shape for fixing to a chassis (frame) of a moving body or the like.

The wiring elements are formed using a metal material with good conductivity, such as Cu. The wiring elements include a wiring layer. The wiring layer is sometimes called a wiring, a wiring pattern, or the like. The wiring layer may be formed by patterning metal foil, for example, or may be formed by printing. In addition to the wiring layer, the wiring elements may include a through-hole land or a via conductor. The through-hole land is formed on a wall surface of a through-hole that penetrates the printed circuit board 21 in the Z direction. The through-hole land may be formed around the opening along with the wall surface of the through-hole. The via conductor is formed by arranging a conductor such as plating in a through hole (via) formed in an insulating layer constituting the insulating base material 211. The via conductors electrically connect the wiring layers arranged in different layers, for example.

The wiring elements may include a wiring layer disposed on the surface layer on the side of the first surface 21*a* with respect to the insulating base material 211, or may include a wiring layer disposed on the surface layer on the side of the back surface 21*b*. The wiring elements may include a wiring layer disposed inside the insulating base material 211. The wiring layer may be arranged in only one layer with respect to the insulating base material 211, or may be arranged in multiple layers.

The electronic component 22 is mounted on the printed circuit board 21. A plurality of electronic components 22 are mounted on the printed circuit board 21. The electronic components 22 are generally arranged on the side of one surface 21*a* and/or the side of the back surface 21*b* of the printed circuit board 21. At least a part of the electronic components 22 may be built into the insulating base material 211. The electronic components 22 form a circuit together with the wiring elements described above. The wiring elements and/or the electronic components 22 are circuit elements.

The electromagnetic shielding body 30 covers predetermined circuit elements on the circuit board 20. The electromagnetic shielding body 30 may be placed so as to cover all the circuit elements formed on the circuit board 20, or may be placed so as to cover a specific circuit element. The electromagnetic shielding body 30 may be placed so as to cover a specific circuit element that is a noise source, or may be placed so as to cover a specific circuit element that is desired to suppress the influence of external noise. The electromagnetic shielding body 30 may cover the wiring elements or the electronic components 22, for example. Of course, the electromagnetic shielding body 30 may cover the wiring elements and the electronic components 22.

<Electromagnetic Shielding Body>

The electromagnetic shielding body 30 may accommodate the circuit board 20 or may be mounted on the printed circuit board 21. As an example, the electromagnetic shielding body 30 of the present embodiment is mounted on the printed circuit board 21. The electromagnetic shielding body 30 covers the specific circuit elements that are noise sources.

The electromagnetic shielding body 30 includes a first member 31, a second member 32, and a fixing member 33. Since the first member 31 is arranged inside the second member 32, the first member 31 may be referred to as an internal member. Since the first member 31 is a mounting portion of the printed circuit board 21 in the electromagnetic shielding body 30, it is sometimes referred to as a board connecting member or the like.

The first member 31 has an inner wall 311. The inner wall 311 has a cylindrical shape extending in the Z direction. The inner wall 311 has a predetermined height in the Z direction and is ring-shaped in the plan view. The inner wall 311 is sometimes referred to as a wall, a cylinder, a side wall, or the like. The inner wall 311 has an outer peripheral surface 311*a* and openings 311*b* and 311*c*. The opening 311*b* of the inner wall 311 is an opening on the opposite side with respect to the printed circuit board 21. The opening 311*c* is an opening on the printed circuit board 21 side in the inner wall 311. The inner wall 311 accommodates the circuit elements within the cylinder. In the example shown in FIGS. 1 to 3, the inner wall 311 accommodates the electronic components 22 arranged on one surface 21*a*.

The first member 31 may have only the inner wall 311 or may have a portion continuous extending to the inner wall 311. For example, a portion continuous extending to the inner wall 311 may include a flange extending in a diameter expansion direction from an end of the inner wall 311 on the printed circuit board 21 side. As an example, the first member 31 of the present embodiment has only the inner wall 311. The inner wall 311 is soldered to a land (not shown) that is part of a wiring layer provided on the surface layer of the one surface 21*a* of the printed circuit board 21.

The inner wall 311 has an outer shape with no corners in the plan view. The outer shape of the inner wall 311 without corners is a non-intersecting, convex and closed shape. The outer shape of the inner wall 311 may be a line symmetric shape or a non-axisymmetric shape. As the outer shape of the inner wall 311, an oval shape may be adopted. As shown in FIGS. 1 and 2, the outer shape of the inner wall 311 may be an elliptical shape. The ellipse shape is a type of the oval shape. As another oval shape, an oblong shape or an egg shape may be adopted. For example, as in another example shown in FIG. 4, the outer shape of the inner wall 311 may be an oblong shape with rounded corners. The oblong shape with rounded corners is composed of two parallel lines of equal length and two semicircles. The oblong shape with rounded corners is a shape mainly used for tracks in athletic stadiums, for example.

Figure 6:
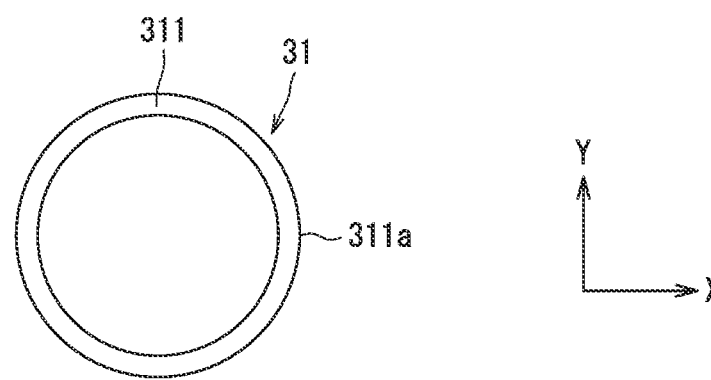
FIG. 6 is a plan view showing other example of a first member.

The outer shape of the inner wall 311 may have a straight part like the oblong shape with rounded corners described above, or may have a shape without a straight part as in another example shown in FIG. 5, for example. The outer shape of the inner wall 311 may be a curved line that is differentiable around the entire circumference. The outer shape without a straight part is not limited to the example shown in FIG. 5. For example, as in another example shown in FIG. 6, the outer shape of the inner wall 311 may be circular (perfect circular shape).

An inner shape of the inner wall 311 may be similar to an outer shape thereof. A thickness of the inner wall 311 may be substantially uniform around the entire circumference. The inner shape of the inner wall 311 may be different from the outer shape thereof. The thickness of the inner wall 311 may be partially different. The inner wall 311 preferably has such rigidity that it hardly deforms when the fixing member 33 is tightened. The inner wall 311 may be thicker than the outer wall 321, for example.

The first member 31 is formed using a metal material suitable for electromagnetic shielding. The first member 31 may be formed using only a metal material. The first member 31 may be formed using an electrically insulating material such as resin and a metal material. For example, the first member 31 may be a cylindrical resin molded body whose outer peripheral surface is plated. For electrical connection with the second member 32, at least the outer peripheral surface 311*a* of the inner wall 311 is a metal surface. As an example, the first member 31 of the present embodiment is formed using only a metal material.

The second member 32 is disposed outside the inner wall 311 of the first member 31 and is therefore referred to as an external member. The second member 32 covers the first member 31 and is therefore referred to as a cover, a lid member, or the like. The second member 32 may be formed into a predetermined shape and include an outer wall 321 and a ceiling wall 322. The outer wall 321 is arranged to surround the inner wall 311. The outer wall 321 is sometimes referred to as a side wall, a cylindrical portion, or the like. The outer wall 321, like the inner wall 311, has a cylindrical shape. The outer wall 321 has a predetermined height in the Z direction and is ring-shaped in the plan view. In order to suppress local concentration of stress during tightening, the thickness of the outer wall 321 may be made substantially uniform over the entire circumference. The outer wall 321 has a shape similar to the outer shape of the inner wall 311 in the plan view. The outer wall 321 has an outer peripheral surface 321*a* and an inner peripheral surface 321*b*.

By tightening the fixing member 33, the outer wall 321 is electrically connected to the inner wall 311 around the entire circumference. The inner peripheral surface 321*b* of the outer wall 321 is in continuous contact with the outer peripheral surface 311*a* of the inner wall 311 over the entire circumference. The outer wall 321 is in continuous contact with the inner wall 311 over the entire circumference, at least at the tightened portion by the fixing member 33 and its surroundings. The inner peripheral surface 321*b* of the outer wall 321 may contact the outer peripheral surface 311*a* of the inner wall 311 over its entire surface. The outer wall 321 is configured to be deformable by tightening the fixing member 33 so as to come into contact with the inner wall 311. For example, the thickness of the outer wall 321 may be relatively thin.

The ceiling wall 322 is continuous with the outer wall 321 and closes one of the openings of the outer wall 321 having a cylindrical shape. The ceiling wall 322 is sometimes referred to as a bottom portion, a bottom wall, or the like. The ceiling wall 322 closes the opening 311*b* of the inner wall 311. The second member 32 has a lid shape (box shape) with one side open and a predetermined depth. In the fixed state, the ceiling wall 322 may be in contact with the open end of the inner wall 311, or may have a gap between the ceiling wall 322 and the open end.

The second member 32 is formed using a metal material suitable for electromagnetic shielding. The second member 32 may be formed using only a metal material. The second member 32 may be formed using an electrically insulating material such as resin and a metal material. For example, the second member 32 may be a lid-shaped resin molded body whose inner surface is plated. At least the inner surface of the lid-shaped body is a metal surface for electrical connection with the first member 31 and electromagnetic shielding. As an example, the second member 32 of the present embodiment is formed using only a metal material.

Figure 7:
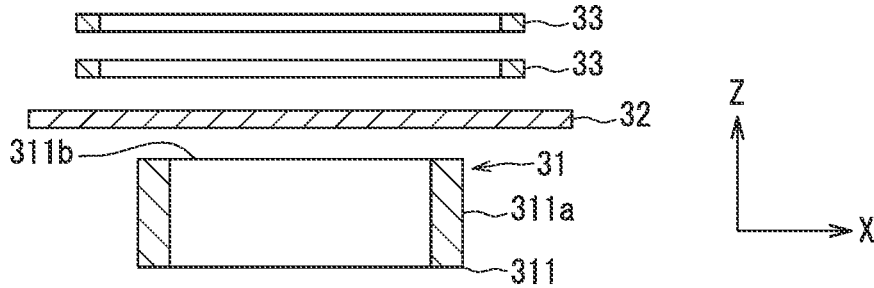
FIG. 7 is a sectional view showing another example of a second member.

The second member 32 is not limited to being formed into a predetermined shape as described above. For example, as in another example shown in FIG. 7, a second member 32 formed of cloth may be employed. The cloth is, for example, a metal cloth. A film, sheet, etc. may be used instead of cloth. In other words, a flexible material may be used. Such a second member 32 does not have the above-mentioned outer wall 321 and ceiling wall 322 in a state before being fixed. When fixed, the second member 32 deforms following the first member 31, and has the outer wall 321 and the ceiling wall 322 in the fixed state.

The fixing member 33 is string-shaped and is tightened to continuously connect (electrically connect) the second member 32 to the outer peripheral surface 311a of the inner wall 311 over the entire circumference. A string shape means long and thin. The string shape also includes a band shape. The material of the fixing member 33 is not particularly limited. For example, an elastically deformable material such as rubber may be used, or a material that can be contracted by applying an external force such as a heat-shrinkable tube may be used. The fixing member 33 may be tightened by the force of a spring. For example, a spring type hose clamp may be used.

Figure 8:
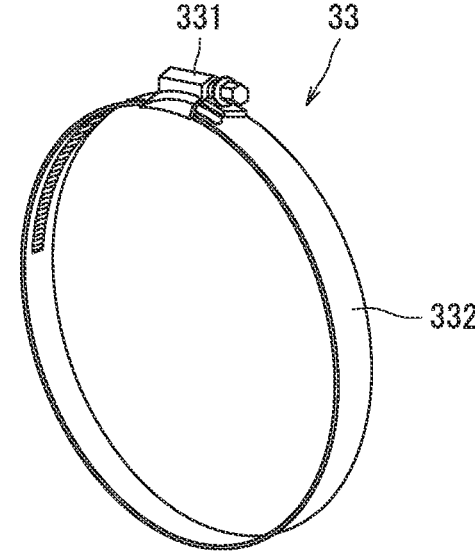
FIG. 8 is a diagram showing an example of a fixing member.

As the fixing member 33, one having a mechanism for adjusting the fixing strength, such as a screw type hose clamp, may be used. FIG. 8 shows an example of the fixing member 33. The fixing member 33 has a metal band 331 and a strength adjustment mechanism 332. The strength adjustment mechanism 332 includes a screw (bolt), and a diameter of the metal band 331 changes according to tightening of the screw, so that the fixing strength can be adjusted. By managing the torque value during screw tightening, the first member 31 and the second member 32 can be fixed with a predetermined (uniform) force.

The fixing member 33 is arranged at a position where the outer wall 321 can be brought into continuous contact with the outer peripheral surface 311a of the inner wall 311 around the entire circumference in the Z direction. It is preferable that the fixing member 33 is placed avoiding the end of the outer peripheral surface 321a of the outer wall 321 on the ceiling wall 322 side. Preferably, it is arranged in a portion of the outer peripheral surface 321a of the outer wall 321 excluding both ends, that is, in the center portion. By arranging the fixing member 33 in the central portion, the contact area can be made wider.

The number of string-shaped fixing members 33 is not particularly limited. The number thereof may be one or more. One fixing member 33 may be wound multiple times. (Simulation Result)

Figure 9:
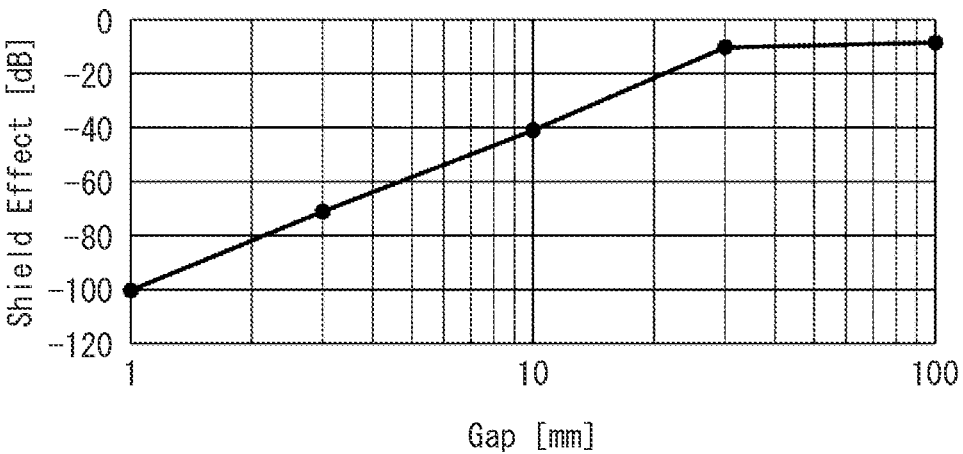
FIG. 9 is a diagram showing a relationship between a gap and a shield effect.

FIG. 9 is a diagram showing a relationship between a gap and a shield effect. The gap is the width of the part of the electromagnetic shield that is not electrically connected, that is, the width of the shield hole. The gap in the electromagnetic shield functions as a slot antenna as described above. The results in FIG. 9 support this point. It is clear from the results shown in FIG. 9 that the larger the gap, the lower the shield effect.

Figure 10:
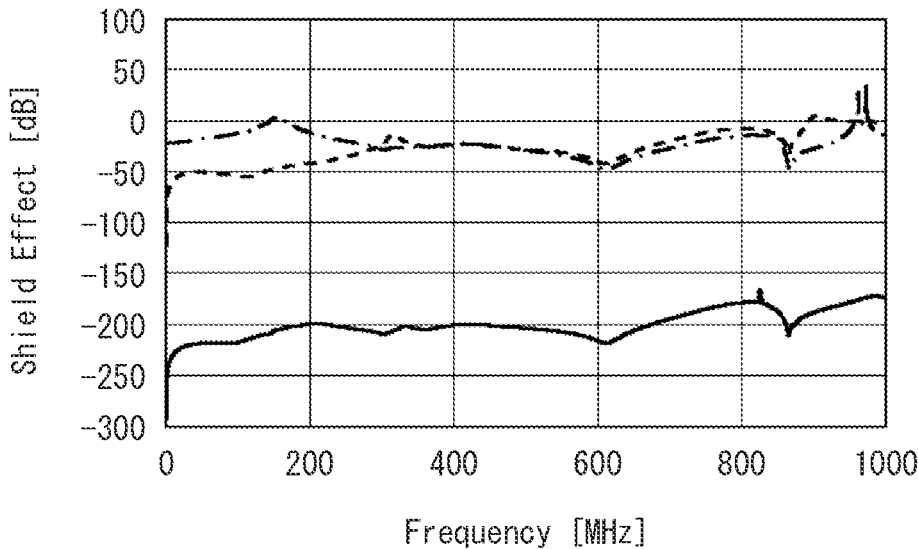
FIG. 10 is a diagram showing a relationship between an electrical connection structure and a shield effect.

FIG. 10 shows a relationship between an electrical connection structure and a shield effect. In FIG. 10, the configuration in which the electromagnetic shielding body is removed from the electronic device in FIG. 1 is used as a reference, and the difference from the reference is shown as the shield effect. A solid line indicates the result of the present embodiment having the configuration shown in FIG. 1. A broken line and a dashed-dotted line show the results of the reference examples. In all of the reference examples, the fixing member is excluded from the electromagnetic shielding body. The configurations of the first member and the second member are the same as in the present embodiment. The reference example shown by the broken line shows the result of a configuration in which the first member and the second member are connected discretely at four locations. The reference example shown by the dashed dotted line shows the result of a configuration in which there is no contact between the first member and the second member. It is clear from the results shown in FIG. 10 that the shield effect can be enhanced by electrically connecting the first member and the second member around the entire circumference.

<Summary of First Embodiment>

According to the present embodiment, the electromagnetic shielding body 30 includes a string-shaped fixing member 33. By tightening the string-shaped fixing member 33, the second member 32 can be brought into contact with the outer peripheral surface 311a of the inner wall 311 of the first member 31 and electrically connected. Furthermore, the outer shape of the inner wall 311 has no corners in the plan view. Therefore, by tightening the fixing member 33, the second member 32 and the inner wall 311 can be electrically connected over the entire circumference. It is possible to have continuous electrical connections without being affected by manufacturing variations such as surface roughness and mounting variations. Therefore, the shield effect can be enhanced with a simple configuration. The shield effect can be enhanced with an inexpensive configuration.

Further, since the second member 32 and the inner wall 311 are connected continuously around the entire circumference, the fixing strength can be increased. Thereby, even when the electromagnetic shielding body 30 is applied to a moving body, it is possible to ensure fixing strength that can withstand a vibration test.

Furthermore, since the string-shaped fixing member 33 is used and the fixing member 33 is disposed on the outer peripheral surface 321a of the outer wall 321 of the second member 32, the tightened state can be easily released. That is, the connection state between the first member 31 and the second member 32 can be easily released. By removing the second member 32, the circuit elements can be evaluated or inspected, for example.

The first member 31 may be a cylindrical member with both ends open in the axial direction. According to this configuration, the shield effect can be enhanced while simplifying the configuration.

The first member 31 may be mounted on the printed circuit board 21. The first member 31 houses the circuit elements while being mounted on the printed circuit board 21. Since the first member 31 provides a mounting portion for the printed circuit board 21 in the electromagnetic shielding body 30, a separate mounting portion is not required. Therefore, the shield effect can be enhanced with a simple configuration.

The outer shape of the inner wall 311 of the first member 31 may be the oval shape. Since the oval shape has no corners, it is possible to suppress local concentration of stress when tightening with the string-shaped fixing member 33. Therefore, the second member 32 and the inner wall 311 can be electrically connected over the entire circumference by the fixing member 33.

The outer shape of the inner wall 311 may be a shape that does not have a straight part. Since the outer shape of the inner wall 311 does not have the straight part, the stress during tightening can be more easily dispersed. In other words, local concentration of stress can be effectively suppressed. Therefore, the electrical connection around the entire circumference can be established more reliably. A part of the oval shape does not have a straight part like the ellipse shape.

The outer shape of the inner wall 311 may be circular. According to this configuration, stress during tightening is evenly distributed. In other words, local concentration of stress can be suppressed more effectively. Therefore, the electrical connection around the entire circumference can be established more reliably.

The outer wall 321 of the second member 32 may have a shape similar to the outer shape of the inner wall 311 in the plan view. Because they have similar shapes to each other, it is easy to make electrical connections around the entire circumference by tightening. As the second member 32, cloth, film, or sheet may be used. In this case, since the second member 32 has flexibility, it is easy to make an electrical connection around the entire circumference by tightening.

The fixing member 33 may include the strength adjustment mechanism 332 that adjusts the fixing strength between the first member 31 and the second member 32. According to this configuration, by managing the torque value, the first member 31 and the second member 32 can be fixed with a predetermined (uniform) force.

Second Embodiment

A second embodiment is a modification of the preceding embodiment as a basic configuration and may incorporate description of the precedent embodiments. In the preceding embodiment, no particular mention was made of the arrangement of the fixing member 33 with respect to the outer peripheral surface 321a of the outer wall 321. In addition to this configuration, a mechanism for guiding the fixing member 33 may be provided on the outer wall 321 of the second member 32.

Figure 11:
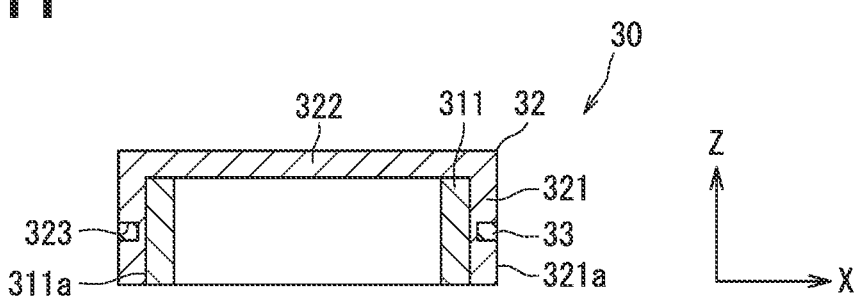
FIG. 11 is a sectional view showing an electromagnetic shielding body according to a second embodiment.

FIG. 11 is a sectional view showing the electromagnetic shielding body 30 according to the present embodiment. FIG. 11 corresponds to FIG. 3. In FIG. 11, the number of fixing members 33 is one for convenience. Further, the circuit board 20 is omitted.

The second member 32 has a concave portion 323 on the outer peripheral surface 321a as a guide mechanism. The concave portion 323 is recessed relative to the other portion of the outer peripheral surface 321a. The concave portion 323 is continuously provided over the entire circumference of the outer peripheral surface 321a. The position of the concave portion 323 in the Z direction is the same position (has the same height) all around the circumference. The concave portion 323 accommodates the string-shaped fixing member 33 around its entire circumference. The concave portion 323 has a depth and width that accommodate the fixing member 33.

The fixing member 33 is arranged along the guide mechanism. The fixing member 33 may be arranged so that a part of the fixing member 33 is located within the space of the concave portion 323 and the other part protrudes from the concave portion 323 around the entire circumference. The fixing member 33 may be arranged so as to be located within the space of the concave portion 323 around the entire circumference. The fixing member 33 is arranged along the concave portion 323. The position of the fixing member 33 is determined by the concave portion 323. The arrangement of the fixing member 33 is limited by the concave portion 323.

Figure 12:
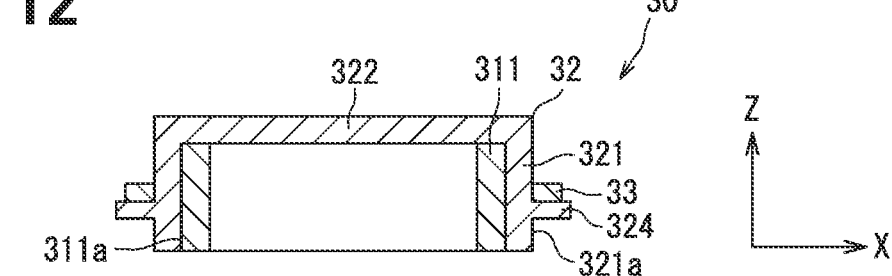
FIG. 12 is a sectional view showing another example of the second member.

Although an example in which the concave portion 323 is provided as a guide mechanism has been shown, the present disclosure is not limited to this configuration. For example, as shown in FIG. 12, a convex portion 324 may be provided on the outer peripheral surface 321a. The convex portion 324 protrudes from other parts of the outer peripheral surface 321a. The convex portion 324 is provided so as to surround the outer peripheral surface 311a (inner wall 311) in plan view. The convex portion 324 may be provided continuously over the entire circumference of the outer peripheral surface 321a, or may be provided discontinuously. The position of the convex portion 324 in the Z direction is the same position (same height) all around the circumference. The convex portion 324 has a predetermined height.

The fixing member 33 is arranged along the guide mechanism. The fixing member 33 is arranged along the convex portion 324. The fixing member 33 is placed in contact with one side of the convex portion 324. The fixing member 33 is disposed in contact with one side of the convex portion 324 and a peripheral part of the convex portion 324 that is the outer peripheral surface 321a. The fixing member 33 may be arranged such that a portion thereof is located radially outward from a protruding tip of the convex portion 324. The fixing member 33 may be arranged so as not to protrude outward beyond the protruding tip of the convex portion 324. The position of the fixing member 33 is determined by the convex portion 324. The arrangement of the fixing member 33 is limited by the convex portion 324. Other configurations are the same as those described in the prior embodiments.

The convex portions 324 may be provided multiple times, and the fixing member 33 may be placed in a recess formed by adjacent convex portions 324 and a portion of the outer peripheral surface 321a between the convex portions 324.
<Summary of Second Embodiment>

According to the present embodiment, a mechanism for guiding the fixing member 33 is provided on the outer peripheral surface 321a of the outer wall 321. Specifically, the concave portion 323 or the convex portion 324 is provided. Thereby, the arrangement of the string-shaped fixing member 33 can be restricted. That is, the fixing member 33 can be placed at a predetermined position. Therefore, the fixing strength can be increased.

The configuration described in the present embodiment can be combined with any of the configurations described in the preceding embodiments except for the configurations in which cloth, film, or sheet is used as the second member 32.

Third Embodiment

A second embodiment is a modification of the preceding embodiment as a basic configuration and may incorporate description of the precedent embodiments. In the preceding embodiment, the first member 31 was surface mounted on the printed circuit board 21. Alternatively, the first member 31 may be inserted and mounted on the printed circuit board 21.

Figure 13:
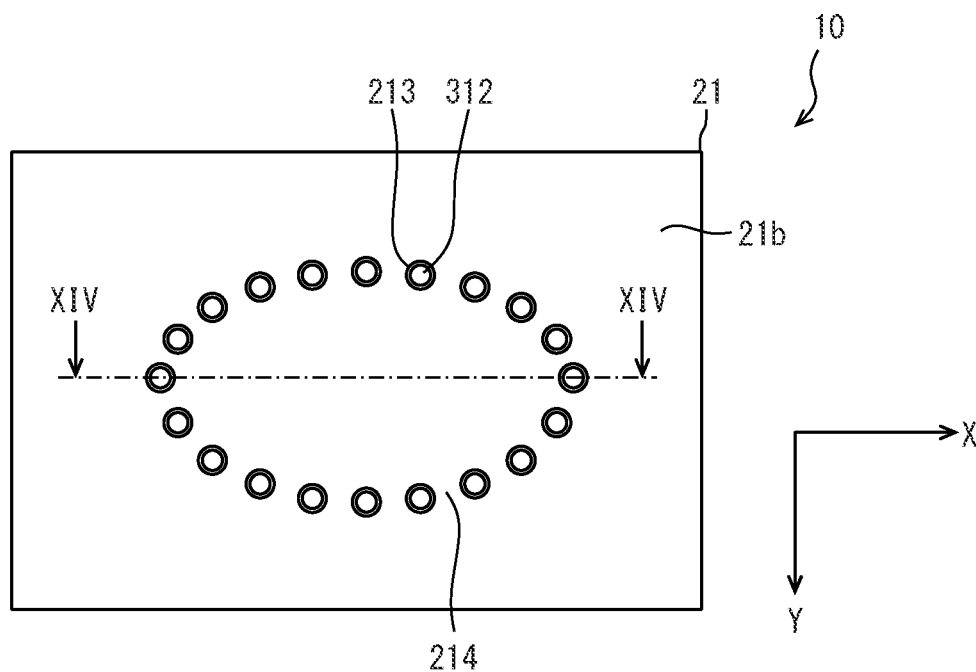
FIG. 13 is a plan view showing an electromagnetic shielding body and an electronic device according to a third embodiment.
Figures 14, 15:
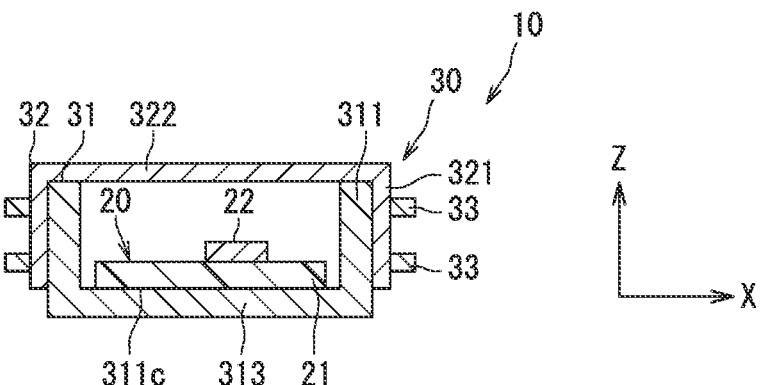
FIG. 14 is a sectional view taken along a line XIV-XIV in FIG. 13.
FIG. 15 is a cross-sectional view showing an electromagnetic shielding body and an electronic device according to a fourth embodiment.

FIG. 13 is a plan view of the electronic device 10 according to the present embodiment viewed from the back surface 21b side of the printed circuit board 21. In FIG. 13, solder is omitted for convenience. FIG. 14 is a sectional view taken along a line XIV-XIV in FIG. 13.

As shown in FIGS. 13 and 14, the printed circuit board 21 has a plurality of through holes 213. Each of the through holes 213 penetrates the printed circuit board 21 in the Z direction. A land is provided on the wall surface of the through hole 213. The land is part of the wiring element. The land is sometimes referred to as a through-hole land. The plurality of through holes 213 are provided along a lower end of the inner wall 311 at predetermined intervals.

The printed circuit board 21 may have a ground layer 214 disposed on the back surface 21b. The ground layer 214 provides a reference potential (ground potential) on the printed circuit board 21. The ground layer 214 is part of the wiring layer. The ground layer 214 has a larger area than other wiring layers. The ground layer 214 may be arranged on almost the entire surface of the back surface 21b, or may be arranged on a part of the back surface 21b including the surrounding area of the through hole 213.

The inner wall 311 of the first member 31 has a plurality of legs 312 extending in the Z direction from the end on the printed circuit board 21 side. The legs 312 are provided at predetermined intervals over the entire circumference of the inner wall 311. Each of the legs 312 is inserted and mounted on the printed circuit board 21 in a state where the legs 312 are inserted through the corresponding through hole 213. Each of the legs 312 is connected to a through-hole land via solder 40. A portion of the leg 312 protruding from the back surface 21b is connected to the ground layer 214 via the solder 40.

The intervals between the legs 312 are set so that radio waves do not leak from between the legs 312. By setting the interval less than or equal to ½ wavelength of a predetermined frequency, it functions as a shield wall that blocks noise at a predetermined frequency. When it is desired to block noise of multiple frequencies, it is preferable to set the interval to ½ wavelength or less of the lowest frequency. The intervals between the through holes 213 are set so that the legs 312 function as a shield wall. Other configurations are the same as those described in the prior embodiments.

<Summary of Third Embodiment>

According to the present embodiment, the first member 31 has a plurality of legs 312. Then, the legs 312 are inserted and mounted into the through hole 213 of the printed circuit board 21. The plurality of legs 312 and through holes 213 are provided at predetermined intervals so that the legs 312 function as a shield wall. Therefore, electromagnetic noise can be prevented from leaking to the back surface 21b side of the printed circuit board 21.

The ground layer 214 may be provided on the back surface 21b of the printed circuit board 21, and each of the legs 312 may be connected to the ground layer 214. Since the legs 312 and the ground layer 214 are electrically connected, the circuit element can be surrounded by a shield structure including the electromagnetic shielding body 30 and the ground layer 214. Therefore, leakage of electromagnetic noise can be prevented in all directions including the portion directly below the circuit element.

The configuration described in the present embodiment can be combined with any of the configurations described in the preceding embodiments except for the configurations in which cloth, film, or sheet is used as the second member 32.

<Modification>

Instead of the legs 312, a shield wall using a via conductor may be provided inside the printed circuit board 21. The via conductors are provided along the edge of the inner wall 311 at predetermined intervals. The interval between the via conductors is preferably set to a distance of ½ wavelength or less of the frequency of the noise to be blocked. When it is desired to block noise of multiple frequencies, it is preferable to set the interval to ½ wavelength or less of the lowest frequency. The via conductor may be electrically connected to the inner wall 311.

Fourth Embodiment

A second embodiment is a modification of the preceding embodiment as a basic configuration and may incorporate description of the precedent embodiments. In the previous embodiments, the first member 31 had only the inner wall 311. Alternatively, the first member 31 may have a bottom wall. In the preceding embodiments, the electromagnetic shielding body 30 was mounted on the printed circuit board 21. Alternatively, the electromagnetic shielding body 30 may accommodate the printed circuit board 21.

FIG. 15 is a cross-sectional view showing the electronic device 10 according to the present embodiment. FIG. 15 corresponds to FIG. 3. The first member 31 has a bottom wall 313 in addition to the inner wall 311. The bottom wall 313 is connected to the end of the inner wall 311 on the opposite side to the ceiling wall 322, and closes an opening 311c. The first member 31 has a box shape with one side open. In such a configuration, the first member 31 is sometimes referred to as a lower case, and the second member 32 is sometimes referred to as an upper case. The first member 31 and the second member 32 are sometimes referred to as a housing.

The circuit board 20 is arranged in a space defined by the first member 31 and the second member 32. The other configurations are the same as those of the preceding embodiments.

<Summary of Fourth Embodiment>

According to the present embodiment, the first member 31 has the bottom wall 313. The first member 31 and the second member 32 form a so-called housing. In such a configuration, the inner wall 311 has a contour without corners, similar to the configurations described in the previous embodiments. The fixing member 33 has a string shape and electrically connects the outer wall 321 to the outer peripheral surface 311a of the inner wall 311 over the entire circumference by tightening. That is, even when the circuit board 20 is accommodated within the electromagnetic shielding body 30, the shield effect can be enhanced with a simple configuration.

The configuration described in the present embodiment can be combined with the configurations described in the preceding embodiments except for the configurations that must be mounted on the printed circuit board 21.

Other Embodiments

The disclosure in this specification and drawings is not limited to the exemplified embodiments. The disclosure encompasses the illustrated embodiments and modifications by those skilled in the art based thereon. For example, the disclosure is not limited to the combinations of components and/or elements shown in the embodiments. The disclosure may be implemented in various combinations. The disclosure may have additional portions that may be added to the embodiments. The disclosure encompasses omission of components and/or elements of the embodiments. The disclosure encompasses the replacement or combination of components and/or elements between one embodiment and another. The disclosed technical scope is not limited to the description of the embodiments. It should be understood that some disclosed technical ranges are indicated by description of claims, and includes every modification within the equivalent meaning and the scope of description of claims.

The disclosure in the specification, drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

When an element or a layer is described as "disposed above" or "connected", the element or the layer may be directly disposed above or connected to another element or another layer, or an intervening element or an intervening layer may be present therebetween. In contrast, when an element or a layer is described as "disposed directly above" or "directly connected", an intervening element or an intervening layer is not present. Other terms used to describe the relationships between elements (for example, "between" vs. "directly between", and "adjacent" vs. "directly adjacent") should be interpreted similarly. As used herein, the term "and/or" includes any combination and all combinations relating to one or more of the related listed items. For example, the term A and/or B includes only A, only B, or both A and B.

Spatial relative terms "inside", "outside", "back", "bottom", "low", "top", "high", etc. are used herein to facilitate the description that describes relationships between one element or feature and another element or feature. Spatial relative terms can be intended to include different orientations of a device in use or operation, in addition to the orientations depicted in the drawings. For example, when the device in the figure is flipped over, an element described as "below" or "directly below" another element or feature is directed "above" the other element or feature. Therefore, the term "below" can include both above and below. The device may be oriented in the other direction (rotated 90 degrees or in any other direction) and the spatially relative terms used herein are interpreted accordingly.

What is claimed is:

1. An electromagnetic shielding body, comprising:
a first member including a wall portion, the wall portion having
    a cylindrical shape to thereby form a cylinder, and
    an opening and an outer shape without corners in a plan view in an axial direction, and
    accommodating a circuit element in the cylinder;
a second member configured to cover the wall portion from an outer peripheral surface side and closes one opening of the wall portion; and
a string-shaped fixing member disposed on an outer surface of a portion of the second member that covers the wall portion and configured to electrically connect the second member and the wall portion over an entire circumference.

2. The electromagnetic shielding body according to claim 1, wherein
the first member is a cylindrical member whose both ends are open in the axial direction.

3. The electromagnetic shielding body according to claim 2, wherein the first member is mounted on a printed circuit board.

4. The electromagnetic shielding body according to claim 1, wherein
the wall portion is a side wall with openings,
the first member has a bottom wall that is continuous with the side wall and closes one of the openings of the side wall, and
the second member is arranged at an end of the side wall opposite to the bottom wall.

5. The electromagnetic shielding body according to claim 1, wherein
an outer shape of the wall portion is oval shape.

6. The electromagnetic shielding body according to claim 1, wherein
the outer shape of the wall portion is a shape having no straight part.

7. The electromagnetic shielding body according to claim 6, wherein
the outer shape of the wall portion is circular.

8. The electromagnetic shielding body according to claim 1, wherein
the wall portion is an inner wall,
the second member has an outer wall with openings arranged to surround the inner wall, and a ceiling wall that is continuous with the outer wall and closes one of the openings of the outer wall, and
the outer wall has a shape similar to the outer shape of the inner wall in plan view.

9. The electromagnetic shielding body according to claim 1, wherein
the second member is formed using cloth, a film, or a sheet.

10. The electromagnetic shielding body according to claim 1, wherein
the fixing member has a screw type hose clamp that adjusts fixing strength.

11. The electromagnetic shielding body according to claim 8, wherein
the second member has a concave portion or a convex portion that guides the fixing member on an outer peripheral surface of the outer wall.

12. An electronic device, comprising:
a circuit board having a printed board and an electronic component mounted on the printed board; and
an electromagnetic shielding body configured to cover predetermined circuit elements on the circuit board, wherein
the electromagnetic shielding body includes
a first member including a wall portion, the wall portion having
    a cylindrical shape to thereby form a cylinder, and
    an opening and an outer shape without corners in a plan view in an axial direction, and
    accommodating a circuit element in the cylinder;
a second member configured to cover the wall portion from an outer peripheral surface side and close an opening in the wall portion that is located away from the printed board, and
a string-shaped fixing member disposed on an outer surface of a portion of the second member that covers the wall portion and configured to electrically connect the second member and the wall portion over an entire circumference.

13. The electronic device according to claim 12, wherein the first member has a plurality of legs extending from an end of the wall portion on the printed board side and provided at predetermined intervals over the entire circumference, and the printed board has a plurality of through holes into which the plurality of legs are individually inserted and mounted.

14. The electronic device according to claim 13, wherein the printed circuit board has a ground layer that provides a reference potential on a surface opposite to the surface on which the wall portion is arranged, and each of the legs is connected to the ground layer.

* * * * *